(12) United States Patent
Khandelwal et al.

(10) Patent No.: US 9,546,419 B2
(45) Date of Patent: Jan. 17, 2017

(54) METHOD OF REDUCING TUNGSTEN FILM ROUGHNESS AND RESISTIVITY

(71) Applicant: Applied Materials, Inc., Santa Clara, CA (US)

(72) Inventors: Amit Khandelwal, San Jose, CA (US); Avgerinos V. Gelatos, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/968,144

(22) Filed: Aug. 15, 2013

(65) Prior Publication Data

US 2014/0147589 A1 May 29, 2014

Related U.S. Application Data

(60) Provisional application No. 61/729,925, filed on Nov. 26, 2012.

(51) Int. Cl.
| | |
|---|---|
| *C23C 16/06* | (2006.01) |
| *C23C 16/02* | (2006.01) |
| *C23C 16/14* | (2006.01) |
| *C23C 16/455* | (2006.01) |

(52) U.S. Cl.
CPC ........... *C23C 16/0281* (2013.01); *C23C 16/14* (2013.01); *C23C 16/45525* (2013.01)

(58) Field of Classification Search
None
See application file for complete search history.

(56) References Cited

U.S. PATENT DOCUMENTS

| | | | | |
|---|---|---|---|---|
| 6,099,904 | A   * | 8/2000  | Mak et al. | ..................... 427/253 |
| 2001/0026835 | A1 * | 10/2001 | Tanaka | ................ H01L 21/2026 |
| | | | | 438/149 |
| 2002/0190379 | A1 * | 12/2002 | Jian et al. | ..................... 257/751 |
| 2003/0104126 | A1 * | 6/2003  | Fang et al. | ............. 427/255.392 |
| 2004/0202786 | A1 * | 10/2004 | Wongsenakhum et al. | .. 427/250 |
| 2005/0031786 | A1 * | 2/2005  | Lee | .................. H01L 21/28556 |
| | | | | 427/255.28 |
| 2009/0149022 | A1 * | 6/2009  | Chan | ....................... C23C 16/02 |
| | | | | 438/660 |

* cited by examiner

*Primary Examiner* — Joseph Miller, Jr.
(74) *Attorney, Agent, or Firm* — Patterson & Sheridan, LLP

(57) ABSTRACT

Methods for controlling crystal size in bulk tungsten layers are disclosed herein. Methods for depositing a bulk tungsten metal layer can include positioning a substrate with a barrier layer in a processing chamber, forming a tungsten nucleation layer, post-treating the nucleation layer with one or more treatment gas cycles including an activating gas and a purging gas, heating the substrate to a deposition temperature, and depositing a bulk tungsten layer with alternating nitrogen flow on the nucleation layer. The post-treatment cycling can be applied optionally to the bulk metal deposition with alternating nitrogen flow.

20 Claims, 3 Drawing Sheets

METHOD OF REDUCING TUNGSTEN FILM ROUGHNESS AND RESISTIVITY

CROSS-REFERENCE TO RELATED APPLICATIONS

This application claims benefit of U.S. Provisional Patent Application Ser. No. 61/729,925, filed Nov. 26, 2012, which is herein incorporated by reference.

BACKGROUND OF THE INVENTION

Field of the Invention

Embodiments of the invention relate generally to methods for processing a substrate during semiconductor manufacturing. Specifically, embodiments of the invention relate to methods of treating a nucleation layer prior to a CVD deposition process.

Description of the Related Art

Reliably producing nanometer-sized features is one of the key technologies for the next generation of semiconductor devices. The shrinking dimensions of circuits and devices have placed additional demands on processing capabilities. The multilevel interconnects that lie at the heart of integrated circuit technology require precise processing of high aspect ratio features, such as vias and other interconnects. Reliable formation of these interconnects is very important to future success and to the continued effort to increase circuit density and quality of individual substrates.

Metallization of features formed on substrates includes CVD deposition of metals such as tungsten. Tungsten can be used for metal fill of source contacts, drain contacts, metal gate fill and gate contacts as well as applications in DRAM and flash memory. With technology node shrinkage, tungsten films are required to have low resistivity and low roughness for device characteristics and for integration with subsequent process steps. Low resistivity in tungsten has been previously achieved by increasing the grain size. However, increased grain size results in increased film roughness. Typical roughness of low resistivity tungsten film is approximately 15% of film thickness.

Therefore, there is much effort in the art to improve the tungsten film morphology while maintaining the low film resistivity.

SUMMARY OF THE INVENTION

Embodiments of the present invention generally provide methods of CVD deposition of metals to maintain both low resistivity and low roughness. Specifically, the present invention generally provides methods to control both resistivity and roughness of bulk deposited tungsten. In one embodiment, a method for depositing a bulk metal can include positioning a substrate in a processing chamber, the substrate having an barrier layer formed on the surface, forming a nucleation layer, treating the nucleation layer with one or more treatment gas cycles, heating the substrate to a deposition temperature, and depositing a bulk metal layer on the nucleation layer with one or more metal layer deposition cycles. The treatment gas cycles can include flowing an activating gas, and flowing a treatment purging gas. The metal layer deposition cycles can include depositing a first layer on the nucleation layer by reacting a first processing gas, the first processing gas comprising a tungsten halide, a hydrogen-containing gas and a nitrogen-containing gas; purging the first processing gas from the chamber using a first purge gas, the first purge gas comprising the hydrogen-containing gas; depositing a second layer on the first layer by reacting a second processing gas, the second processing gas comprising the tungsten halide and the hydrogen-containing gas; and purging the second processing gas from the chamber using a second purge gas, the second purge gas comprising the hydrogen-containing gas.

In another embodiment, a method for depositing a bulk metal can include positioning a substrate in a processing chamber, heating the substrate to a deposition temperature, depositing a nucleation layer on the surface of the substrate, wherein the nucleation layer comprises tungsten, and depositing a bulk metal layer on the initiating layer with one or more metal layer deposition cycles. The metal layer deposition cycles can include flowing a first processing gas to the substrate to deposit a first layer, the first processing gas comprising tungsten halide, hydrogen-containing gas and a nitrogen-containing gas; flowing a first purge gas to the processing chamber, the first purge gas comprising the hydrogen-containing gas; flowing a second processing gas to the substrate to deposit a second layer, the second processing gas comprising the tungsten halide and the hydrogen-containing gas; and flowing a second purge gas to the processing chamber, the second purge gas comprising the hydrogen-containing gas.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally provide methods of CVD deposition of metals, such as tungsten, with a smaller grain size while maintaining a low resistivity. Deposition of tungsten in features by standard techniques can lead to an increase in both the starting bulk and the overall resistance of the deposition product. Standard CVD bulk tungsten deposition can create a low resistivity film, such as a tungsten film from $WF_6$ and $H_2$ which has a resistivity of less than 20 µΩ-cm. However, these low resistivity films have a high roughness due to the formation of large crystals. Other tungsten containing layers, such as tungsten nitride (WN) have a lower roughness but at a cost of increased resitivity. The methods described herein reduce the crystal size of the formed tungsten layer while maintaining low resistivity.

Though exemplary embodiments and explanations focus on tungsten or titanium, it is understood that metals other than tungsten can used with the deposition techniques described herein without diverging from the invention as disclosed. The invention as disclosed herein is clarified with reference to the figures discussed below.

Figure 1:
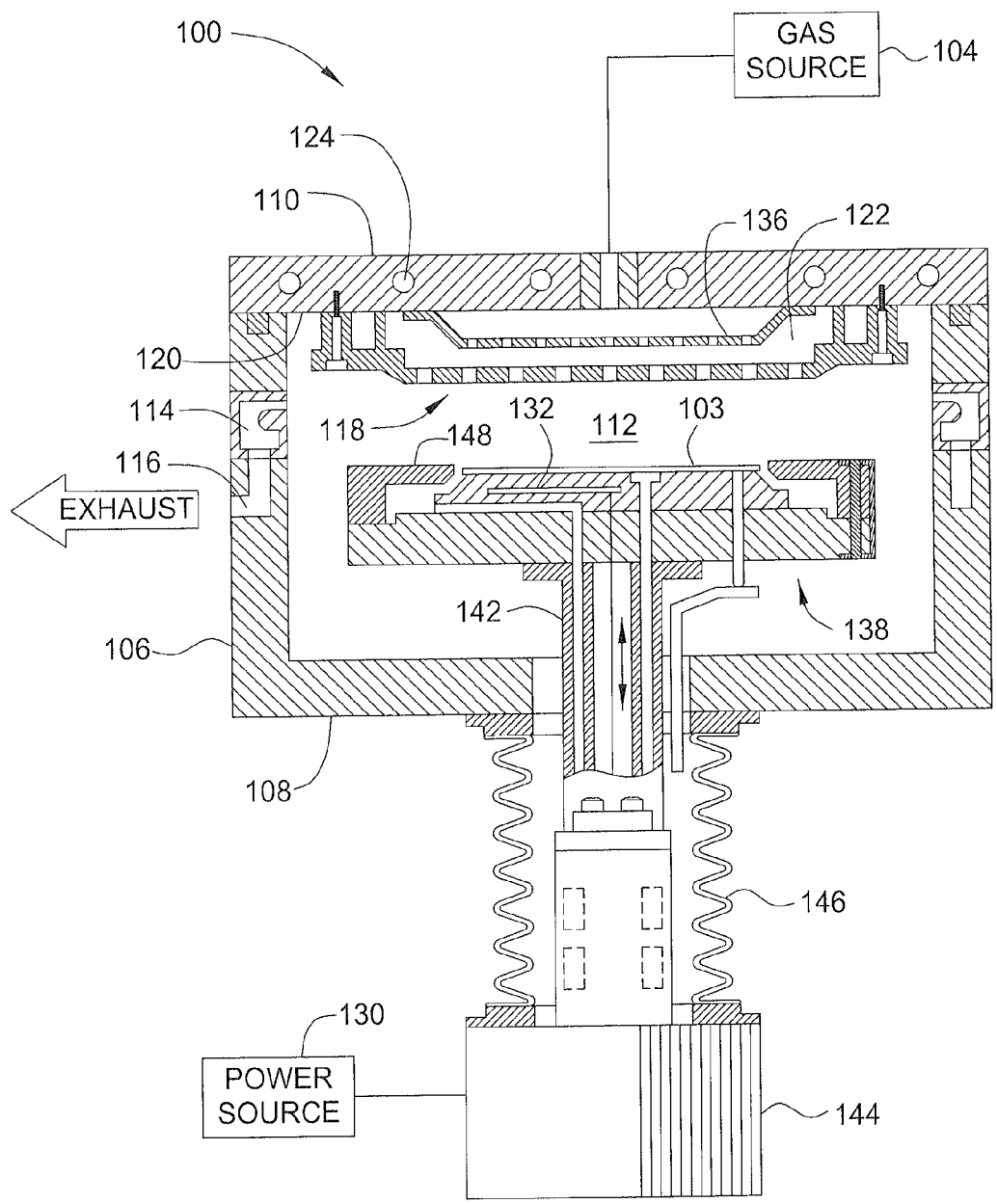
FIG. 1 is a schematic cross-sectional view of a process chamber that can be used to perform a cyclical deposition process according to one embodiment.

FIG. 1 is a schematic cross-sectional view of a CVD process chamber 100 that may be used for depositing a tungsten layer according to the embodiments described herein. Such a process chamber 100 is available from Applied Materials, Inc. located in Santa Clara, Calif., and a brief description thereof follows. An integrated processing system capable of performing the nucleation and bulk layer deposition methods described herein is the Centura® tungsten chemical vapor deposition chamber, available from Applied Materials, Inc. located in Santa Clara, Calif. It is to be understood that the chamber described below is an exemplary embodiment and other chambers, including chambers from other manufacturers may be used with or modified to match embodiments of this invention without diverging from the inventive characteristics described herein.

The process chamber 100 may be part of a processing system (not shown) that includes multiple processing chambers connected to a central transfer chamber (not shown) and serviced by a robot (not shown). The process chamber 100 includes walls 106, a bottom 108, and a lid 110 that define a process volume 112. The walls 106 and bottom 108 are typically fabricated from a unitary block of aluminum. The walls 106 may have conduits (not shown) therein through which a fluid may be passed to control the temperature of the walls 106. The process chamber 100 may also include a pumping ring 114 that couples the process volume 112 to an exhaust port 116 as well as other pumping components (not shown).

A substrate support assembly 138, which may be heated, may be centrally disposed within the process chamber 100. The substrate support assembly 138 supports a substrate 103 during a deposition process. The substrate support assembly 138 generally is fabricated from aluminum, ceramic or a combination of aluminum and ceramic and typically includes a vacuum port (not shown) and at least one or more heating elements 132.

The vacuum port may be used to apply a vacuum between the substrate 103 and the substrate support assembly 138 to secure the substrate 103 to the substrate support assembly 138 during the deposition process. The one or more heating elements 132, may be, for example, electrodes disposed in the substrate support assembly 138, and coupled to a power source 130, to heat the substrate support assembly 138 and substrate 103 positioned thereon to a predetermined temperature.

Generally, the substrate support assembly 138 is coupled to a stem 142. The stem 142 provides a conduit for electrical leads, vacuum and gas supply lines between the substrate support assembly 138 and other components of the process chamber 100. Additionally, the stem 142 couples the substrate support assembly 138 to a lift system 144 that moves the substrate support assembly 138 between an elevated position (as shown in FIG. 1) and a lowered position (not shown). Bellows 146 provide a vacuum seal between the process volume 112 and the atmosphere outside the chamber 100 while facilitating the movement of the substrate support assembly 138.

The substrate support assembly 138 additionally supports a circumscribing shadow ring 148. The shadow ring 148 is annular in form and typically comprises a ceramic material such as, for example, aluminum nitride. Generally, the shadow ring 148 prevents deposition at the edge of the substrate 103 and substrate support assembly 138.

The lid 110 is supported by the walls 106 and may be removable to allow for servicing of the process chamber 100. The lid 110 may generally be comprised of aluminum and may additionally have heat transfer fluid channels 124 formed therein. The heat transfer fluid channels 124 are coupled to a fluid source (not shown) that flows a heat transfer fluid through the lid 110. Fluid flowing through the heat transfer fluid channels 124 regulates the temperature of the lid 110.

A showerhead 118 may generally be coupled to an interior side 120 of the lid 110. A perforated blocker plate 136 may optionally be disposed in the space 122 between the showerhead 118 and lid 110. Gases (i.e., process and other gases) that enter the process chamber 100 through the mixing block 134 are first diffused by the blocker plate 136 as the gases fill the space 122 behind the showerhead 118. The gases then pass through the showerhead 118 and into the process chamber 100. The blocker plate 136 and the showerhead 118 are configured to provide a uniform flow of gases to the process chamber 100. Uniform gas flow is desirable to promote uniform layer formation on the substrate 103.

Figure 2:
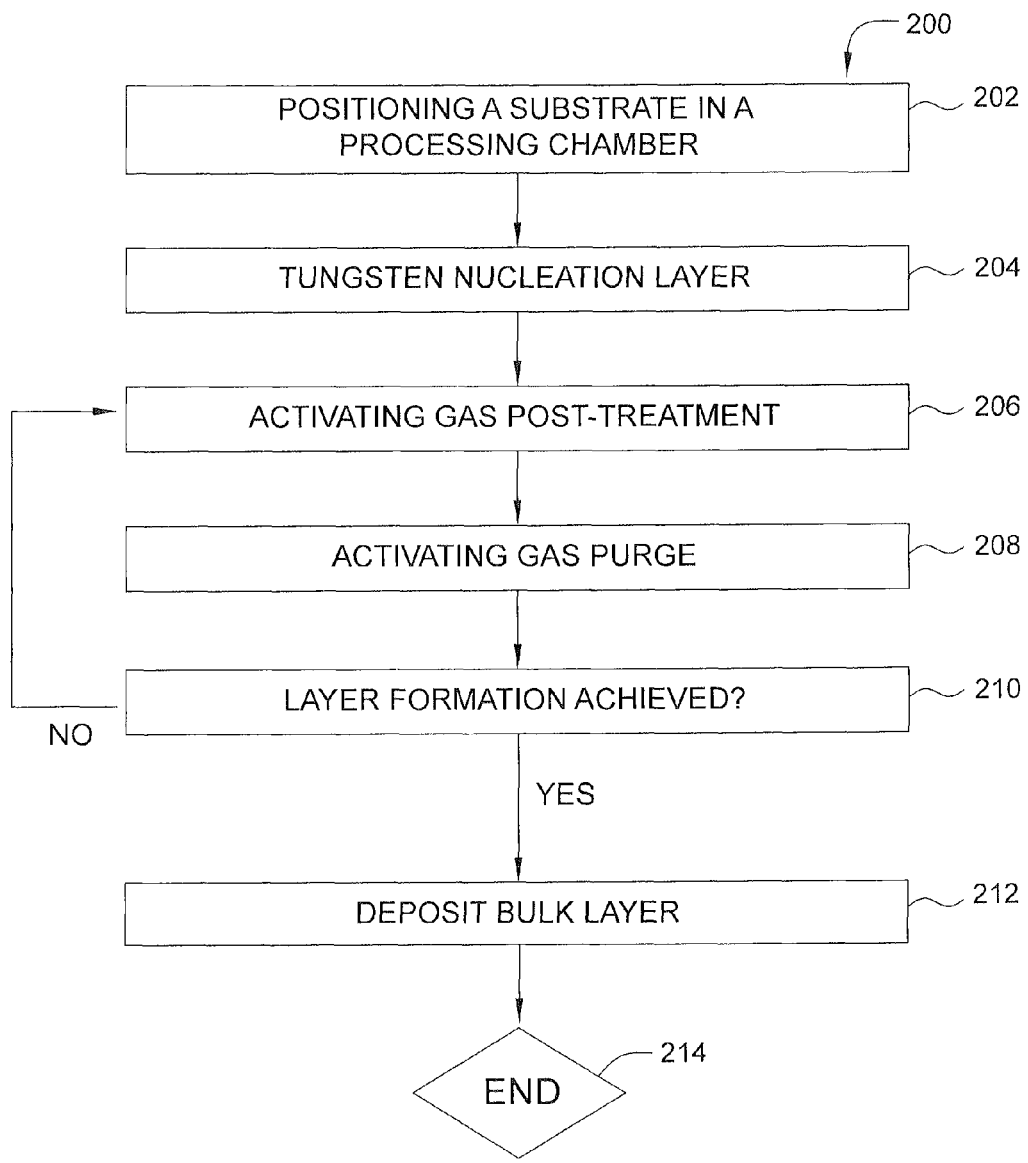
FIG. 2 is a block diagram of a method for depositing a bulk tungsten layer according to one embodiment.

FIG. 2 is a block diagram of a method 200 for depositing a fill layer according to one embodiment. Post-treatment of the nucleation layer with diborane can reduce resistivity by increasing the grain size of the deposited layer. However, an increased grain size is believed to increase the roughness of the deposited layer. Thus, the embodiments described here can be used to decrease grain size while maintaining the low resistivity. The method 200 can include positioning a substrate in a processing chamber, as in 202. The substrate can be of any composition, such as a crystalline silicon substrate. The substrate can have a WN or a TiN barrier layer deposited over the surface. The barrier layer can be a primarily WN or TiN layer with various impurities therein, such as a WN layer with between 35%-60% tungsten, 20%-30% nitrogen and the remaining comprising oxygen and carbon. The substrate can also include one or more features, such as a via or an interconnect. The substrate may have layers formed thereon, such as dielectric or conductive material layers.

The processing chamber used with one or more embodiments can be any CVD processing chamber, such as the chamber described above or chambers from other manufacturers. Flow rates and other processing parameters described below are for a 200 mm substrate. It should be understood these parameters can be adjusted based on the size of the substrate processed and the type of chamber used without diverging form the invention disclosed herein.

A "substrate surface", as used herein, refers to any substrate or material surface formed on a substrate upon which film processing is performed. For example, a substrate surface on which processing can be performed includes materials such as silicon, silicon oxide, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride. A substrate surface may also include dielectric materials such as silicon dioxide and carbon doped silicon oxides. Substrates may have various dimensions, such as 200 mm or 300 mm diameter wafers, as well as rectangular or square panes.

The method 200 can include forming a nucleation layer, as in 204. In this embodiment, the nucleation layer is deposited by an ALD process. The ALD process can include adsorption of a tungsten halide over the exposed surface of the substrate. The tungsten halide may be selected from all available tungsten halides, such as tungsten hexafluoride ($WF_6$) or tungsten hexachloride ($WCl_6$). The tungsten halide can be provided to the substrate at a constant pressure, such as 5 Torr. Further, the tungsten halide can be adsorbed at a temperature between 250° C. and 350° C., such as 300° C.

After the tungsten halide has been adsorbed on the substrate, the chamber can then be purged of the remaining gases using an inert gas, such as argon. The substrate can then be treated with a reactant gas, such as diborane, silane or disilane which reacts with the adsorbed tungsten halide to produce metallic tungsten on the adsorbed surfaces and halide gases which are purged as above. The deposited thin tungsten layer can have a final thickness of between 10 Å and 100 Å, such as 25 Å. It is important to note that other embodiments may include nucleation layers formed by other techniques, without diverging from the invention described herein.

The method 200 can include a post-treatment with an activating gas, as in 206. After the formation of the nucleation layer is complete, a purge gas including an inert gas, such as argon (Ar), may be pulsed into the processing chamber to remove any residual tungsten-containing precursor or by-products remaining from forming the nucleation layer. In another embodiment, the substrate surface may be exposed to a post soak process or a post-treatment in the same or a different process chamber. The post-treatment may contain the activating gas and an optional carrier gas. The activating gas may adsorb and/or react to the substrate surface, namely the nucleation layer, to form a treated surface for subsequent bulk layer deposition. The activation gases may be selected form the group comprising silane, disilane, diborane, hydrogen and combinations thereof. In preferable embodiments, the activation gas is diborane.

In one embodiment, diborane ($B_2H_6$) gas flows into the process chamber over a number of cycles to form a treated surface on the nucleation layer. By performing shorter cycle times, the likelihood of boron adsorbing into the substrate surface or the nucleation layer is diminished. The flow rates can vary based on operation dependent factors such as the size of the substrate, the size of the chamber or active gas concentrations. The flow rates for a treatment cycle using $B_2H_6$ can be less than 100 sccm for a 200 mm substrate. In one embodiment, $B_2H_6$ flows into the process chamber for a period from 2-10 seconds. The amount of time and the number of cycles can add up to a time frame of from 20 seconds to 30 seconds for the post-treatment activation gas. The time frame of the activating gas flow can vary between cycles so long as the total time frame is between 20 and 30 seconds over the total cycles. For example, the first cycle can include flowing the activating gas to the substrate for 4 seconds and the second cycle can include flowing the activating gas to the substrate for 6 seconds, alternating in that fashion for a total of four cycles. One skilled in the art will understand that further permutations are possible without diverging from the scope of the invention described herein.

The method 200 can include purging the chamber, as in 208. The post-treatment cycles generally include a treatment portion and a purge portion. In one embodiment, the substrate would be treated for a time with an activating gas and then receive an equal amount of time in the presence of a purge gas. The purge can include hydrogen ($H_2$) and/or an inert gas, such as argon (Ar). The time for the purge portion can be equal to the time for the treatment portion. In one embodiment, the amount of time and the number of cycles add up to a time frame of from 20 seconds to 30 seconds for the post-treatment purge gas. The flow rates can vary based on operation dependent factors such as the size of the substrate, the size of the chamber or active gas concentrations.

The method 200 can include determining if the boron layer has been formed, as in 210. The general pre-soak process described herein is based on a number of equal cycles over a period of time. This process can be varied so that the cycles are longer or shorter on a subsequent repeat. In one embodiment, $B_2H_6$ is flowed into the process chamber for a 3 second period. The chamber is purged for 3 seconds using an argon gas flow and the overall process is performed seven times. In further embodiments a 5 second time frame or a 10 second time frame may be employed with a total of four cycles and two cycles respectively. Post-treatment of the nucleation layer will tend to provide a starting layer for the bulk deposition process with a smaller grain size while maintaining a lower resistivity.

Though the embodiments above may describe the flow of both the activation gas and the purge gas over the same amount of time or at the same flow rate, it is generally believed that the flow of purge gas is of secondary importance to the flow of the activation gas. As such, the flow of the activation gas and the flow of the purge gas may not reflect each other. The purge gas flow is primarily to prevent adsorption of the activation gas beyond the surface of the nucleation layer. In one embodiment, the purge gas may be flowed between 2 and 20 seconds.

Without intending to be bound by theory, it is believed to be important to the overall resistivity to reduce the amount of boron adsorbed into the tungsten layer. Incorporation of boron is believed to increase the resistivity of a deposited tungsten layer. The resistance for ALD tungsten deposited from $B_2H_6$ and $WF_6$ is approximately 150 $\mu\Omega$-cm. Thus it is believed that by reducing the concentration of boron adsorbed into the substrate during the post-treatment process, the resistance of the tungsten layer can be minimized.

The method 200 can include deposition of a bulk layer, as in 212. Bulk layer can be deposited using a standard means, such as a tungsten fill layer is deposited by a CVD process. The CVD process can be any available CVD process, such as a thermal CVD process. The reactant gases for the CVD can include a tungsten halide, such as $WF_6$ or $WCl_6$, and a hydrogen-containing gas, such as $H_2$. In further embodiments, the bulk layer can be deposited by a cyclic deposition process, described hereafter with reference to FIG. 3.

Once the bulk layer is deposited on the nucleation layer to a desired thickness, the method 200 can be halted, as in 214. In this embodiment, deposition on the upper surface of the barrier layer is expected to be slower than deposition on the feature portion of the barrier layer, due to the partially formed nucleation layer. In preferred embodiments, the thickness of the upper surface portion of the fill layer once deposition is complete is between 1500 Å to 3500 Å. The substrate can then be removed from the chamber for further processing.

Figure 3:
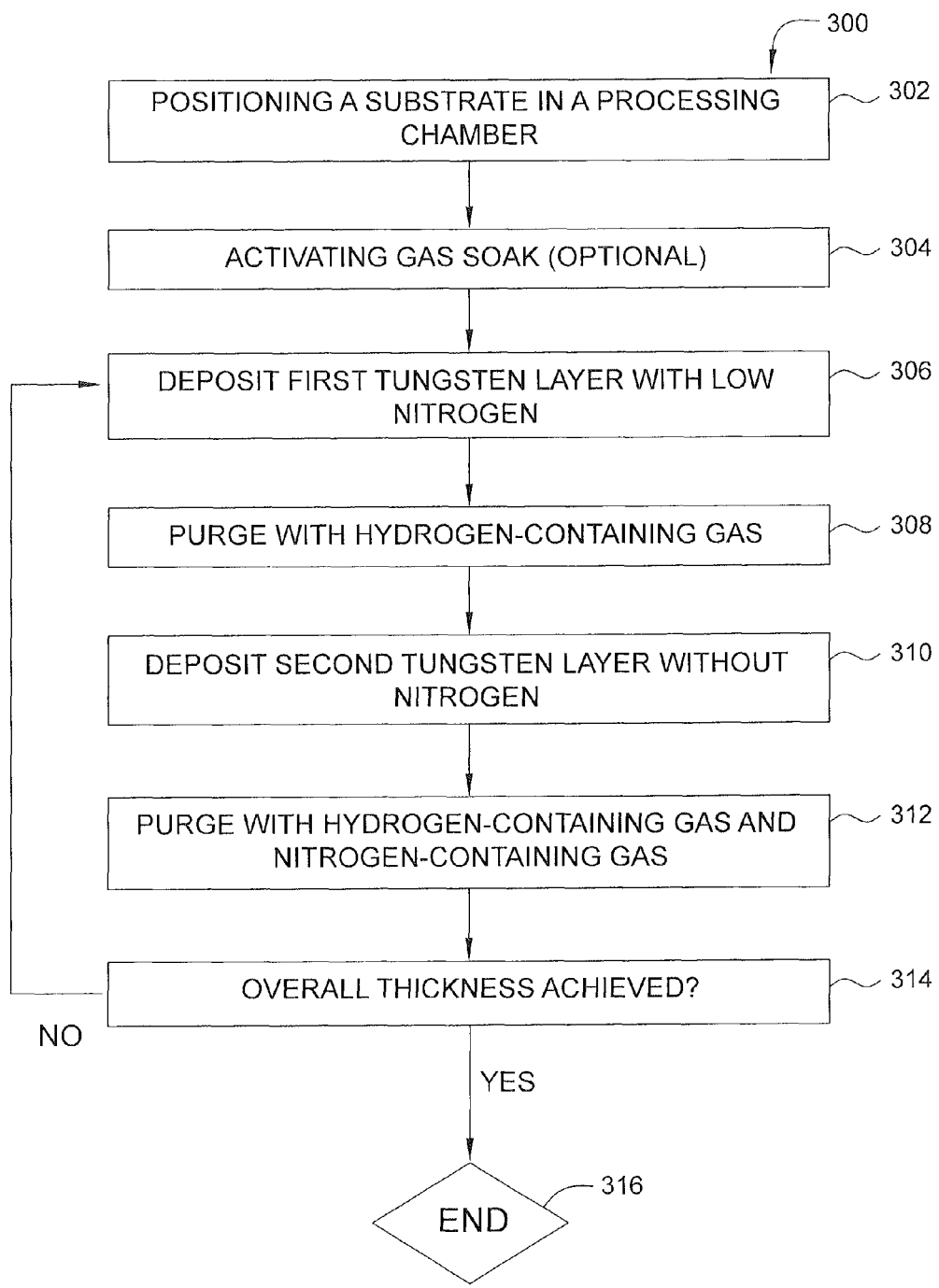
FIG. 3 is a block diagram of a method for depositing a bulk tungsten layer according to another embodiment.

FIG. 3 is a block diagram of a method for depositing a bulk tungsten layer according to another embodiment. During the tungsten deposition process, the grain size of the deposited bulk layer can reflect the grain size of the underlying layer. As such, when a tungsten nucleation layer is deposited with a large grain size in an effort to reduce the resistivity of the layer, the tungsten bulk layer will generally reflect the large grain size, thus creating a rough surface.

Rough surfaces are undesirable for later processing as the roughness is enhanced by further layer deposition. By cycling the bulk deposition constituents for the tungsten layer while using an alternating nitrogen gas flow, the grain size can be reduced for the subsequently deposited tungsten layer allowing for better conformality while maintaining low resistivity.

The method 300 can include positioning a substrate in a processing chamber, as in 302. The substrate and the processing chamber in the embodiment described in FIG. 3 can be substantially similar to the substrate and processing chamber described with reference to FIG. 2. The substrate can have a nucleation layer formed on the surface of the barrier layer or the nucleation layer can be formed by the method described with reference to FIG. 2.

The method 300 can include an optional activating gas soak, as in 304. The activating gas soak can be performed by the method described with reference to FIG. 2. In this embodiment, the starting grain size of the nucleation layer is less important, as the deposited bulk layer is controlled so as to reduce the grain size below that which would natively grow of the nucleation layer. Other processes for the post-treatment of the nucleation layer which can be employed for the optional activating gas soak are further described in commonly assigned U.S. Pat. No. 8,071,478.

The method 300 can include a cyclic deposition of the bulk tungsten layer beginning with depositing a first tungsten layer in the presence of nitrogen, as in 306. After the tungsten nucleation layer has been formed over the barrier layer, a bulk layer is deposited by a CVD process. The reactant gases for the CVD can include a metal halide, such as a tungsten halide, a hydrogen-containing gas, such as $H_2$, and a nitrogen-containing gas, such as $N_2$ or $NH_3$. Examples of metal halides can include $WF_6$ or $WCl_6$. The nitrogen generally comprises less than 1% of the first processing gas. In one embodiment, the nitrogen flow rate is very low, such as less than 100 sccm for a standard 200 mm substrate, to prevent permanent incorporation of the nitrogen into the tungsten layer.

Not wishing to be bound by theory, it is believed that the metal halides are adsorbed on the exposed surface and reacted with H to form a metal deposition. For example, the tungsten hexafluoride ($WF_6$) or tungsten hexachloride ($WCl_6$) is believed to be adsorbed on the exposed surface of the substrate which reacts to form $WF_5$ and F. The $H_2$ is believed to be catalyzed by the exposed and unbound tungsten to form H atoms from $H_2$. The H atoms can then react with the adsorbed F to create HF which desorbs from the surface leaving behind metallic tungsten and further adsorption sites. The reaction mechanism of $WF_6$ can be summarized as follows:

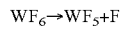

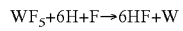

$WCl_6$ is believed to have a similar reaction mechanism. The reaction mechanism above requires an available catalyst for the formation of hydrogen atoms from $H_2$. In the absence of a catalyst, the available binding sites for $WF_6$ is rate limiting. Tungsten nitride (WN) and Titanium nitride (TiN) are not a good catalysts for the formation of H atoms from $H_2$. By co-flowing nitrogen with the bulk tungsten deposition gas, WN is believed to transiently form on the surface of the deposited layer. Though WN is known to have a higher resistivity than pure tungsten, the WN is not believed to significantly incorporate into the overall structure. Thus, the transient WN formation is believed to cause the tungsten crystals form slower and smaller during bulk deposition without increasing the resistance, as would be expected by WN deposition. Therefore, the size of tungsten crystals formed by this method are smaller without affecting the resistivity of the deposited layer.

Temperature also affects the formation of atomic hydrogen from $H_2$. As such, the growth temperature for the fill layer can be between 250° C. and 450° C., with preferred embodiments between 300° C. and 350° C. As the nitrogen controls the deposition by controlling the catalysis of hydrogen, it is important to prevent other factors involved in atomic hydrogen formation, such as temperature. At temperatures above 450° C., hydrogen can form without catalytic conversion, thus the crystal size is believed to be less controlled at temperatures above 450° C.

The method 300 can include following the deposition of the first tungsten layer with flowing a purge gas comprising hydrogen-containing gas to the substrate, as in 308. The chamber can then be cleared of the combination using a purge gas comprising hydrogen ($H_2$). The purge gas can be used to clear unreacted species from the previous deposition process as well as adsorb hydrogen to the surface of the bulk layer. By adsorbing hydrogen, it is believed that remaining reactants will be reacted and remaining nitrogen will be displaced for the tungsten surface. The purge gas is delivered for a substantially similar period of time as the deposition time of the bulk layer with low flow nitrogen.

The method 300 can include following the flowing the purge gas comprising hydrogen-containing gas to the substrate with depositing a second tungsten layer, as in 310. The second tungsten layer is deposited in the absence of nitrogen. In one embodiment, the conditions for this deposition remain substantially the same as the deposition in the presence of nitrogen, including expected thickness, the time period for deposition, temperatures, flow rates and the like. In this step, temperature is less critical, as the formation of the crystals on this layer are expected to reflect the crystal formation of the previous bulk tungsten layer.

The method 300 can include following the deposition of the second tungsten layer with flowing a purge gas comprising hydrogen-containing gas and a nitrogen containing gas to the substrate, as in 312. The chamber can then be cleared of the combination using a purge gas comprising hydrogen ($H_2$) and a nitrogen containing gas. The nitrogen containing gas can be $N_2$. The purge gas can be used to clear unreacted species from the previous deposition process as well as adsorb hydrogen to the surface of the bulk layer. By adsorbing hydrogen, it is believed that remaining reactants will be reacted and remaining nitrogen will be displaced for the tungsten surface. Nitrogen is simultaneously flowed to stabilize the deposited layer. The purge gas is delivered for a substantially similar period of time as the deposition time of the previous bulk tungsten layer.

The method 300 can include a determination of whether the desired thickness of the tungsten layer has been achieved, as in 314. If the desired thickness has not been achieved, the cycle can be repeated one or more times. Not only will the repeated cycle increase the conformality of the layer over multiple depositions, but it will also maintain a low resistivity of the overall layer. Standard roughness for low resistivity tungsten layers deposited by prior art techniques have been shown to be approximately 15% of the thickness of the layer. Tungsten layers deposited by the above method have been shown to have a standard roughness of around 4.5% of the thickness of the layer while maintaining the low resistivity.

Once the bulk layer is deposited on the nucleation layer to a desired thickness, the method 300 can be halted, as in 316. In this embodiment, deposition on the upper surface of the barrier layer is expected to be slower than deposition on the feature portion of the barrier layer, due to the partially formed nucleation layer. In preferred embodiments, the thickness of the upper surface portion of the fill layer once deposition is complete is between 1500 Å to 3500 Å. The substrate can then be removed from the chamber for further processing.

CONCLUSION

Embodiments of the present invention generally provide methods of controlling the size of crystal formation during the bulk deposition of tungsten while simultaneously maintaining a low resistivity. Previous techniques of creating a low resistivity tungsten layer generally required the formation of large crystals. These large crystals affected to overall conformality of layers deposited thereafter. By cycling the post treatment step to control the crystals formed from the surface of the nucleation layer, the crystal size can be reduced without increasing resistivity of the tungsten layer. The crystal size can be further maintained by alternating treatment with nitrogen to slow crystal formation after nucleation has begun.

While the foregoing is directed to embodiments of the invention, other and further embodiments of the invention may be devised without departing from the basic scope thereof, and the scope thereof is determined by the claims that follow.

What is claimed is:

1. A method for depositing a bulk metal, comprising:
    positioning a substrate in a processing chamber, the substrate having an barrier layer formed on the surface;
    forming a nucleation layer;
    treating the nucleation layer with one or more treatment gas cycles, the treatment gas cycles sequentially comprising:
        flowing an activating gas; and
        flowing a treatment purging gas;
    heating the substrate to a deposition temperature; and
    depositing a bulk metal layer on the nucleation layer with one or more metal layer deposition cycles, the metal layer deposition cycles sequentially comprising:
        depositing a first layer on the nucleation layer by reacting a first processing gas, the first processing gas comprising a tungsten halide, a hydrogen-containing gas, and a nitrogen-containing gas;
        purging the first processing gas from the chamber using a first purge gas, the first purge gas comprising the hydrogen-containing gas;
        depositing a second layer on the first layer by reacting a second processing gas, the second processing gas comprising the tungsten halide and the hydrogen-containing gas, the second processing gas being free of nitrogen; and
        purging the second processing gas from the chamber using a second purge gas, the second purge gas comprising the hydrogen-containing gas.

2. The method of claim 1, wherein the tungsten halide is selected from the group consisting of tungsten hexafluoride ($WF_6$), tungsten hexachloride ($WCl_6$) and combinations thereof.

3. The method of claim 1, wherein the hydrogen-containing gas is $H_2$.

4. The method of claim 1, wherein the second purge gas further comprises the nitrogen-containing gas.

5. The method of claim 1, wherein the nitrogen-containing gas is $N_2$.

6. The method of claim 5, wherein the $N_2$ gas is less than 1% of the first processing gas.

7. The method of claim 1, wherein the activating gas is diborane.

8. The method of claim 1, wherein the treatment purging gas comprises argon gas.

9. The method of claim 1, wherein the activating gas is flowed into the processing chamber for less than or equal to 10 seconds per cycle.

10. The method of claim 1, wherein the treatment purging gas flows into the processing chamber for less than or equal to 10 seconds per cycle.

11. The method of claim 1, wherein the activating gas and the treatment purging gas flow for an equal time period.

12. The method of claim 1, wherein the activating gas flows for a total time period of less than 22 seconds.

13. The method of claim 1, wherein the activating gas and the treatment purging gas are maintained at a cycle number, gas flow rate and gas flow time so as to only deposit on the nucleation layer.

14. The method of claim 1, wherein the pressure is increased during the deposition of the first layer or the second layer.

15. A method for depositing a bulk metal, comprising:
    positioning a substrate in a processing chamber;
    heating the substrate to a deposition temperature;
    depositing a nucleation layer on the surface of the substrate, wherein the nucleation layer comprises tungsten; and
    depositing a bulk metal layer on the nucleation layer with one or more metal layer deposition cycles, the metal layer deposition cycles sequentially comprising:
        flowing a first processing gas to the substrate to deposit a first layer, the first processing gas comprising tungsten halide, a hydrogen-containing gas and a nitrogen-containing gas;
        flowing a first purge gas to the processing chamber, the first purge gas comprising the hydrogen-containing gas;
        flowing a second processing gas to the substrate to deposit a second layer, the second processing gas comprising the tungsten halide and the hydrogen-containing gas, the second processing gas being free of nitrogen; and
        flowing a second purge gas to the processing chamber, the second purge gas comprising the hydrogen-containing gas.

16. The method of claim 15, wherein the tungsten halide is selected from the group consisting of tungsten hexafluoride ($WF_6$), tungsten hexachloride ($WCl_6$) and combinations thereof.

17. The method of claim 15, wherein the hydrogen-containing gas is $H_2$.

18. The method of claim 15, wherein the second purge gas further comprises the nitrogen-containing gas.

19. The method of claim 15, wherein the nitrogen-containing gas is $N_2$.

20. The method of claim 19, wherein the $N_2$ gas is less than 1% of the first processing gas.

* * * * *